United States Patent Office 3,398,029

Patented Aug. 20, 1968

3,398,029
METHOD OF MAKING SEMICONDUCTOR DEVICES BY DIFFUSING AND FORMING AN OXIDE

Matami Yasufuku, Yokohama-shi, Toyosaku Kawamura, Kanagawa-ken, and Tsuneo Hayashi, Tokyo, Japan, assignors to Fujitsu Limited, Kawasaki, Japan, a corporation of Japan Filed Oct. 5, 1964, Ser. No. 401,735
Claims priority, application Japan, Oct. 3, 1963, 38/53,300
5 Claims. (Cl. 431—152)

Our invention relates to a method of manufacturing semiconductor devices whereby the finished product has improved electrical characteristics and stability.

When a dopant impurity is diffused into silicon, a surface layer of silicon dioxide is simultaneously formed. This surface layer of silicon dioxide is conventionally left on the semiconductor device in order to protect the surface thereof. This silicon-dioxide surface layer which is produced concomitantly with the diffuse operation, contains, however, a large amount of the impurity material which was applied during the diffusion technique, resulting in an electrically unstable surface layer, which causes electrical leakage. Furthermore, this silicon-dioxide layer causes redistributing of impurity material adjacent the silicon surface, resulting in a channeling effect around the p-n junction where it emerges to the surface and thereby causes electrical leakage.

It is an object of the invention to overcome this difficulty. This is accomplished by completely removing the surface oxide layer formed during diffusion or formed both before and during diffusion and thereby containing impurity material. Thereafter, a new surface oxide film is formed on the semiconductor wafer which, when necessary, contains therein a small amount of doping material in the production thereof. When such small amount of doping material is added, it is necessary that the oxide layer be produced at a temperature less than that of the previous diffusion technique.

The oxide film thus made, is electrically more stable while simultaneously chemically superior to the oxide layer produced during the diffusion process of the doping impurity. This makes possible a more useful performance after carrying out the treatment. In order to prevent as much redistribution as possible of the doping material, which has been added by diffusion to the silicon body, the new oxide layer, when formed, is formed at a lower temperature than that of the diffusion of the impurity material. However, when the activation energy, as considered with respect to temperature and the speed of diffusion of impurity into the semicondutcor body and the speed of growth of the new oxide layer on the silicon surface, are compared, the latter growth is faster than the diffusion technique, and consequently one is able to carry out the oxidation coating technique at a lower temperature than necessary for the diffusion of the impurity material. Furthermore, in order to overcome the channeling effect at the p-n junction caused during the production of the first oxide layer, small amounts of impurity material which are necessary to eliminate the channel effect, are mixed into the atmosphere in which the oxidation process takes place during the production of the second coating. This trace of doping material makes possible reducing the channeling effect while simultaneously not affecting the stability of the oxide layer.

The mixing operation of the doping impurity material into the atmosphere which the oxide layer is to be produced prevents channeling both the p-n-p double diffusion type transistor and of the p-n diffusion diode. For instance, the exposed junction of a p-n-p transistor coated by an oxide layer is generally inclined to have an n-type channel. In order to overcome this tendency, it is desirable to add a small amount of p-type impurity to the atmosphere in which the re-oxidized layer is produced.

The invention is further described hereinbelow with reference to the drawings in which.

Figure 1A:
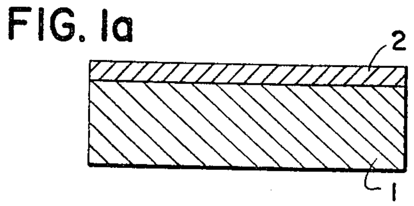
FIG. 1 shows a diode produced according to the invention.
Figure 1B:
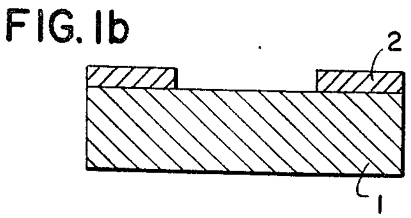
Figure 1C:
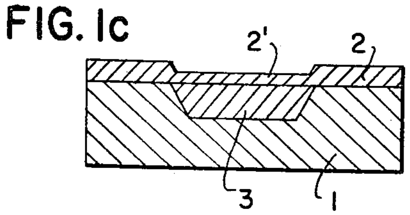
Figure 1D:
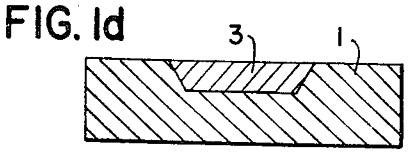
Figure 1E:
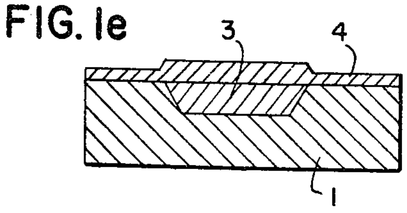
Figure 1F:
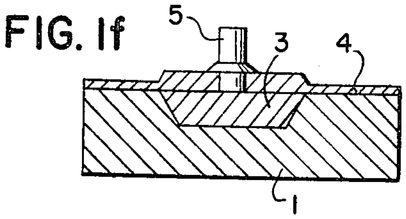

In FIG. 1(*a*) through (*c*) show the prior art technique wherein an n-type silicoin wafer 1 is treated with high temperature steam at approximately 1200° C. produce a silicon dioxide layer 2 of about 5000–10,000 A. After, as shown in (*b*), the oxide film is removed by hydrofluoric acid to leave a window in which doping material is diffused into the semiconductor body 1. In (*c*) of the figure, boron oxide is diffused into the window at a temperature of 1200° C., thereby forming p-type layer 3. Simultaneously with this diffusion, an oxide layer of film 2' is formed, while thickening the oxide film 2. A small portion of oxide film 2' is conventionally removed and an electrode inserted therein. It is at this step that our invention deviates from the prior techniques.

Instead of adding the electrode 2', the entire oxide film 2 and 2' is removed as shown in step (*d*) by the use of hydrofluoric acid in which a small amount of ammonium ion is present. This ammonium ion may conveniently be added as ammonium fluoride. As shown in step (*e*), the semiconductor body is treated by high temperature steam for about 30 minutes at a temperature of about 1100° C. to produce a new oxide film 4. The thickness of the silicon-dioxide film formed, varies as a result of the difference in the density at 3 where the impurity material was deposited. This is readily apparent from figure (*e*). The thicker portion is approximately 6800 A. and the thinner portion 4800 A. According to the invention, a secondary effect can be provided by piling up the pattern of the element in the manufacturing process by utilizing the interference colors of the oxide layer 4. That is, the oxidation takes place until interference colors are noted by the oxide film. Thereafter, a window is etched in the thicker portion of the oxide film 4 by hydrofluoric acid. An aluminum electrode, as illustarted in (*f*) is added to complete the diode.

Figure 2A:
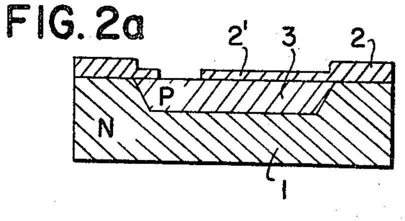
FIG. 2 shows a n-p-n transistor produced according to the invention.
Figure 2B:
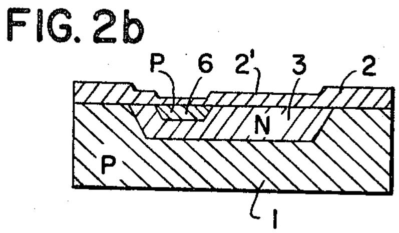
Figure 2C:
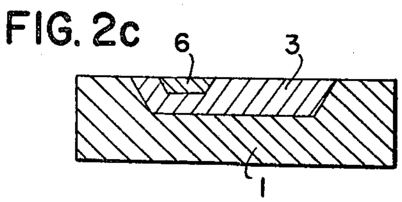
Figure 2D:
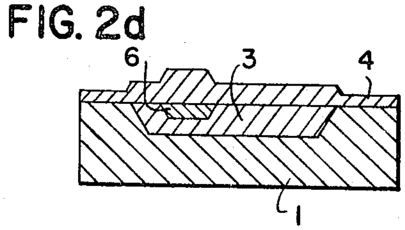
Figure 2E:
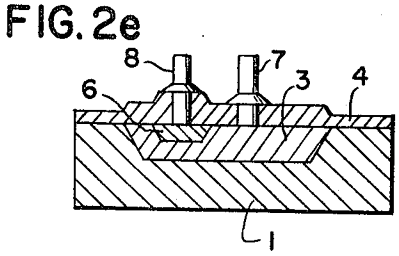

FIG. 2 which shows the manufacture of an n-p-n transistor, will be described hereinbelow. The surface, of an n-type silicon wafer 1, is treated by steam oxidation to a temperature of about 1200° C. to produce oxide film 2 of 5000–10,000 A. thickness. The oxide film is removed by hydrofluoric acid etching from the portion which is to be the base. Thereafter, boron oxide is diffused at a temperature of approximately 1200° C. which results in the p-type base layer 3. Simultaneously with this diffusion, oxide film layer 2' is produced in the same manner as in steps shown in FIG. 1(*a*) through (*c*). Thereafter, a new window is cut into oxide layer 2', as can be seen in the figure. Phosphorus is thereafter diffused into the semiconductor body at a temperature of 1100° C. to result in an n-type emitter layer 6. This can be seen in FIG. 2(*b*).

It is at this point that the procedure of the present invention deviates from the prior art techniques. As is shown in figure (*c*), the entire oxide film is completely removed by the use of hydrofluoric acid to which ammonium ion has been added. Thereafter, a steam oxidation occurs at 1050° C. to establish a new oxide layer 4 as shown in FIG. 2(*d*). As can be seen from figure (*b*), the thickness of the oxide layer varies as in the production of the diode shown in FIG. 2(*e*). Windows are etched into the outside layer by hydrofluoric acid into which base electrode 7 and emitter electrode 8 are inserted in order to complete the n-p-n transistor.

Figure 3A:
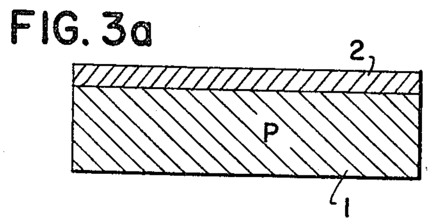
FIG. 3 shows a p-n-p transistor produced according to the invention.
Figure 3B:
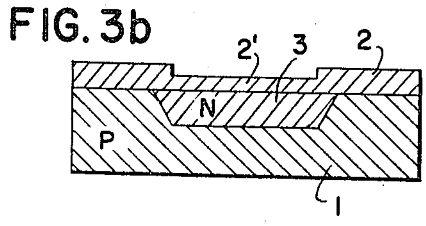
Figure 3C:
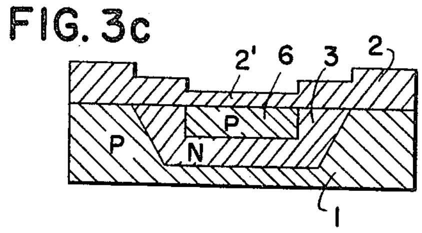
Figure 3D:
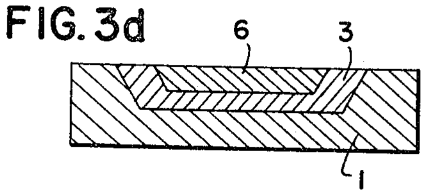
Figure 3E:
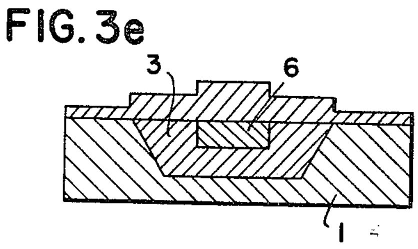
Figure 3F:
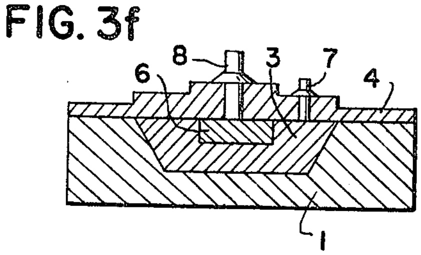

FIG. 3 describes the manufacture of a p-n-p transistor. As shown at (*a*), p-type wafer 1 is treated by steam oxidation to a temperature of about 1200° C. to produce oxide layer 2 of about 5000 to 10,000 A. units. As shown in step (*b*), a window is cut into the oxide layer by hydrofluoric acid. Phosphorus diffusion at about 1200° C. results in n-type layer 3, while simultaneously producing the silicon oxide layer 2' and thickening the oxide layer 2. A second window is etched into oxide layer 2' by hydrofluoric acid for production of the emitter. As a result of boron diffusion at 1500° C., an emitter layer 6 of p-type is formed as shown in FIGURE 3(*c*). It is again at this step that the present invention deviates from the prior art techniques. By using ammonium ion containing hydrofluoric acid, the entire oxide layer 2 and 2' is removed from the surface as shown in FIG. 3(*d*). Thereafter, in a quartz container, an oxide layer is produced by passing steam oxidation and a small amount of boron oxide over the semiconductor body at a temperature of about 1050° C. for about 30 minutes to establish a new silicon-dioxide layer on the wafer surface. This layer contains a small amount of boron. Again, as a result of the varying densities of the semiconductor layers, beneath the oxide layer, the oxide layer has a thickness in accordance with said density. This is illustrated in step (*e*). In step (*f*) the base electrode 7 and the emitter electrode 8 are added to complete the p-n-p transistor.

When using the oxide layer as shown by the present invention, electrical features such as collector reverse current is improved. A small portion of impurity material during the production of a new oxide layer has an even further improving effect particularly when producing the diode and the p-n-p transistor.

We claim:

1. The method of producing a silicon semiconductor device which comprises forming a silicon dioxide layer on the surface of a silicon body while diffusing a doping impurity into a portion of said silicon body, removing the silicon-dioxide layer and thereafter forming a new silicon-dioxide layer at a temperature less than that temperature at which the diffusion took place and adding a small amount of doping material into said new silicon dioxide layer to minimize surface channel effect.

2. The process of claim 1, wherein the silicon dioxide layer is removed by an ammonium ion containing hydrofluoric acid solution.

3. The method of claim 2, wherein the oxidation temperature is about 1100° C. for about thirty minutes.

4. The method of claim 2, wherein the oxidation temperature is about 1050° C. for about thirty minutes.

5. The process of making a p-n-p silicon transistor which comprises diffusing donor and acceptor impurities into a silicon body while simultaneously forming a silicon-dioxide surface on said silicon body, etching off said silicon dioxide layer by an ammonium ion containing hydrofluoric acid solution and thereafter forming a new silicon-dioxide layer at a temperature of about 1050° C. for a period of about thirty minutes.

References Cited

UNITED STATES PATENTS

| | | | |
|---|---|---|---|
| 2,873,222 | 2/1959 | Derick | 148—189 |
| 3,122,817 | 3/1964 | Andrus | 156—17 |
| 3,303,069 | 2/1967 | Tokuyama | 148—187 |
| 3,156,593 | 11/1964 | Ligenza | 148—187 |
| 3,255,056 | 6/1966 | Flatley | 148—187 |

HYLAND BIZOT, *Primary Examiner.*